(12) United States Patent
Chen

(10) Patent No.: US 10,424,706 B2
(45) Date of Patent: Sep. 24, 2019

(54) LED FLIP CHIP DIE-BOND CONDUCTIVE ADHESIVE STRUCTURE AND MOUNTING METHOD THEREOF

(71) Applicant: Jianwei Chen, Shenzhen (CN)

(72) Inventor: Jianwei Chen, Shenzhen (CN)

( * ) Notice: Subject to any disclaimer, the term of this patent is extended or adjusted under 35 U.S.C. 154(b) by 0 days.

(21) Appl. No.: 15/718,042

(22) Filed: Sep. 28, 2017

(65) Prior Publication Data

US 2018/0019385 A1 Jan. 18, 2018

Related U.S. Application Data

(63) Continuation of application No. PCT/CN2015/097649, filed on Dec. 17, 2015.

(30) Foreign Application Priority Data

Jun. 4, 2015 (CN) .......................... 2015 1 0304576

(51) Int. Cl.
*H01L 33/62* (2010.01)
*H01L 33/64* (2010.01)

(52) U.S. Cl.
CPC ............ *H01L 33/62* (2013.01); *H01L 33/641* (2013.01); *H01L 2224/16225* (2013.01); *H01L 2933/0066* (2013.01); *H01L 2933/0075* (2013.01)

(58) Field of Classification Search
CPC .............................. H01L 33/62; H01L 33/641
(Continued)

(56) References Cited

U.S. PATENT DOCUMENTS 6,531,328 B1 * 3/2003 Chen ...................... H01L 24/97
438/106
2001/0011732 A1 * 8/2001 Kohashi ................ H01S 5/0226
257/99
(Continued)

FOREIGN PATENT DOCUMENTS

CN 202067790 U 7/2011
CN 104031578 A 9/2014
(Continued)

OTHER PUBLICATIONS

Englsih translation of CN-202067790-U.*
International Search Report of PCT/CN2015/097649, dated Mar. 3, 2016.

*Primary Examiner* — Sheikh Maruf
(74) *Attorney, Agent, or Firm* — Erson IP (Nelson IP)

(57) ABSTRACT

An LED flip chip die-bond conductive adhesive structure includes an LED flip chip and an electronic circuit board. An LED flip chip negative electrode, an LED flip chip nonmetallic region and an LED flip chip positive electrode are sequentially arranged on a lower surface of the LED flip chip from left to right; a circuit board negative electrode, a circuit board nonmetallic region and a circuit board positive electrode are sequentially arranged on an upper surface of the electronic circuit board from left to right. The LED flip chip and the electronic circuit board are fixedly connected through a thermosetting die-bond insulating adhesive bonded between the LED flip chip nonmetallic region and the circuit board nonmetallic region; and the LED flip chip positive and negative electrodes are respectively conductively connected with the circuit board positive and negative electrodes in a direct metal-metal contact manner.

3 Claims, 14 Drawing Sheets

(58) Field of Classification Search
USPC .......................................................... 257/99
See application file for complete search history.

(56) References Cited

U.S. PATENT DOCUMENTS

| | | | |
|---|---|---|---|
| 2007/0221940 A1* | 9/2007 | Okazaki | H01L 33/60 257/99 |
| 2007/0262328 A1* | 11/2007 | Bando | H01L 24/97 257/79 |
| 2008/0179618 A1* | 7/2008 | Cheng | H01L 33/486 257/99 |
| 2009/0078956 A1* | 3/2009 | Tseng | H01L 33/641 257/98 |
| 2010/0314654 A1* | 12/2010 | Hayashi | H01L 33/486 257/99 |
| 2011/0132644 A1* | 6/2011 | Nishi | H05K 1/056 174/255 |
| 2011/0140154 A1* | 6/2011 | Nakayama | H01L 33/60 257/98 |
| 2011/0220939 A1* | 9/2011 | Nakayama | H01L 33/44 257/98 |
| 2012/0002420 A1* | 1/2012 | Imai | H01L 33/486 362/249.02 |
| 2012/0153486 A1* | 6/2012 | Kuramoto | H01L 21/187 257/762 |
| 2012/0187430 A1* | 7/2012 | West | H01L 25/0753 257/88 |
| 2012/0273034 A1* | 11/2012 | Sato | H01L 31/0392 136/252 |
| 2013/0032846 A1* | 2/2013 | Lin | H01L 33/0079 257/99 |
| 2013/0049044 A1* | 2/2013 | Lee | H01L 33/60 257/98 |
| 2013/0221509 A1* | 8/2013 | Oda | H01L 24/97 257/676 |
| 2015/0237710 A1* | 8/2015 | Yano | H01L 33/62 174/255 |
| 2015/0325763 A1* | 11/2015 | Oda | H01L 23/49503 257/99 |
| 2016/0079504 A1* | 3/2016 | Oda | H01L 24/97 438/27 |

FOREIGN PATENT DOCUMENTS

| | | |
|---|---|---|
| CN | 204289508 U | 4/2015 |
| CN | 104993041 A | 10/2015 |
| CN | 204760379 U | 11/2015 |

* cited by examiner

LED FLIP CHIP DIE-BOND CONDUCTIVE ADHESIVE STRUCTURE AND MOUNTING METHOD THEREOF

CROSS-REFERENCE TO RELATED APPLICATIONS

This application is a continuation of International Patent Application No. PCT/CN2015/097649 with a filing date of Dec. 17, 2015, designating the United States, now pending, and further claims priority to Chinese Patent Application No. 201510304576.1 with a filing date of Jun. 4, 2015. The content of the aforementioned applications, including any intervening amendments thereto, are incorporated herein by reference.

TECHNICAL FIELD

The present invention relates to the field of conductive adhesion of semiconductor elements, and particularly relates to an LED flip chip die-bond conductive adhesive structure and a mounting method thereof.

BACKGROUND OF THE PRESENT INVENTION

In the present technical field, LED flip chip die-bond conductive connection generally adopts two manners, that is, low-temperature tin-gold alloy eutectic conduction and ACA (Anisotropic Conductive Adhesive) conductive adhesion, while the ACA is classified into ACF (Anisotropic Conductive Films) and ACP (Anisotropic Conductive Pastes) according to different colloidal states. A main difference between the ACF and the ACP is as follows: the ACF has anisotropic conductivity before process implementation, while the ACP can reflect the anisotropic conductivity by virtue of certain process flows. A technology closest to the present embodiment is the ACP.

Simply speaking, the ACP is non-conductive in X-axis and Y-axis directions and conductive on a Z axis. A conductive principle of the ACP is as follows: "conductive particles and insulating particles (mean particle size of the conductive particles is greater than that of the insulating particles) are added into a synthetic resin adhesive for uniformly mixing, the adhesive is respectively coated on surfaces of adhered conductors and pressurized and heated, and then adhesive liquid flows, so that a distance between the two conductors is close to a diameter of the conductive particles, and the adhesive is cured. The cured adhesive layer is conducted in a vertical direction (a pressurization direction) due to mutual contact between the conductive particles and the bonded conductors, and insulated in a horizontal direction due to actions of the insulating particles." [1]. A doping ratio of the conductive particles is generally 5%-25% [2].

[1] Research and Application Status of Anisotropic Conductive Adhesives Xiang Hao, Zeng Liming, Hu Chuanqun, Material study and Engineering College of Wuhan University of Technology

[2] Research of Novel Anisotropic Conductive Adhesives Lei Zhihong Polymeric Chemistry and Physics Major ACP conductive particles in Shanghai University:

Conductive fillers are classified into metals, inorganic fillers and mixed fillers. The metals include gold powder, silver powder, copper powder, nickel powder, nickel carbonyl, palladium powder, molybdenum powder, zirconium powder, cobalt powder as well as alloy fillers such as silver-plated metal powder, copper-plated aluminum powder and the like; common inorganic fillers include graphite, carbon black or a mixture of the graphite and the carbon black; and the mixed fillers are products obtained by performing conductive treatment on the metals and the inorganic fillers, such as silver-plated glass beads, silver-plated silica dioxide powder, silver silicides, silicon carbide, tungsten carbide, nickel carbide, palladium carbide, etc." [1]

ACP Implementation Process [2]:

A process flow for conductive adhesive connection is as follows: performing silk-screen printing on conductive adhesives on a substrate→electrocoating non-conductive adhesives→mounting elements on an upper surface of the substrate→curing the conductive adhesives→detecting. An ACP die-bond mounting and assembling LED flip chip structure is shown in FIG. 1.

Problems in the ACP:

"Conductive fillers are key components of the conductive adhesives and endow the conductive adhesives with conductivity properties, and common conductive fillers include gold, silver, copper, nickel and carbon. In various conductive adhesives, due to high cost, generally gold conductive adhesives are rarely used and are mainly applied to relatively high-end fields such as space industry and the like. Although silver conductive adhesives have been applied to electronic products, because silver molecules easily make electrolytic movements, that is, silver migration, under a direct-current electric field and a humid condition, the conductive adhesives have instable conductivity properties and then are limited in applications. Because the copper powder has active chemical property and is easily oxidized by oxygen and water vapor in air, service life of copper conductive adhesives is shortened. Due to high resistance, carbon black and graphite conductive adhesives are unsuitable to serve as microelectronic packaging materials." [2]

"ACA novel conductive filling particles are composed of two parts, wherein a particle core refers to epoxy resin particles, and a silver|copper metal layer is coated outside the core. The novel conductive filling particles also have advantages of silver powder and flexible conductive particles and the like. Densities and thermal expansion coefficients of silver/copper-plated epoxy resin based composite conductive particles are close to those of matrix epoxy resin, sedimentation is not caused even if the conductive particles are used for a long time, and environmental aging resistance of the conductive adhesives can be improved. Plastic deformation of the particles may occur under a pressure effect, thereby enlarging an effective contact area between the conductive particles and electrodes and improving electrical properties of the conductive adhesives." [2]

However, an existing ACA material still has defects such as low conductivity, poor toughness, instable adhesive effects on different base materials, long curing time and the like. The ACA may be improved in several aspects in future as follows:

(1) Development of a novel base material type: EP serves as the most common base material and has defects of high curing temperature, low storage temperature, poor heat resistance and the like. Development of a novel matrix contributes to widening an application range of the ACA.

(2) Development of a novel conductive filler usage of precious metal ions is reduced, which is beneficial for reducing cost and improving efficiency.

(3) Improvement of thermal stability is an important modification trend.

(4) A dispersion technology of conductive particles: the more uniform the dispersion is, the less the agglomeration is, and the more beneficial to maximization of conductive efficiency the effect is." [3]

[3] Research Progress on Anisotropic Conductive Adhesives Xu Ruijie, Lei Caihong, Li Shanliang, Huang Weiliang, Material and Energy College of Guangdong University of Technology "In view of this, a doctor Chen Wencheng in Osram adds that: an existing bottleneck problem of csp is a process problem. If traditional material equipment cannot be directly used at present, even if the csp can reduce cost of products to the greatest degree, production and processing cost is increased. If the csp cannot provide convenience for terminal lighting enterprises, the doctor personally thinks that popularization is very difficult." [4]

[4] "Focusing on OFweek Leader Round-Table Summit to Perform 360-Degree Understanding on LED Package-Free and Flip Chip Technology". This article comes from ofweek semiconductor lighting network, Nov. 22, 2014.

Thus, it can be seen that problems in the ACP used for die-bond conductive adhesion are as follows: metal conductive particles must be added into the ACP, and high cost is caused due to a complicated manufacturing process of the metal particles. The metal particles have poor dispersity and low conductivity in colloid and are high in contact resistance. In a process of implementing the die-bond conductive adhesion by the ACP, an operation process is complicated, and processing cost is high; and since the metal particles exist in ACP colloid, the metal particles are easy to precipitate in the colloid.

The above problems inevitably cause problems of high equipment investment, obvious production process problems, low production efficiency, high cost, poor electrical property and product reliability, difficulty in colloid preservation and the like.

SUMMARY OF PRESENT INVENTION

A technical problem to be solved in embodiments of the present invention is as follows: an LED flip chip die-bond conductive adhesive structure with low production and processing cost, high production efficiency and easiness of realizing large-scale automatic production is provided.

The LED flip chip die-bond conductive adhesive structure comprises an LED flip chip and an electronic circuit board, wherein an LED flip chip negative electrode, an LED flip chip nonmetallic region and an LED flip chip positive electrode are sequentially arranged on a lower surface of the LED flip chip from left to right; a circuit board negative electrode, a circuit board nonmetallic region and a circuit board positive electrode are sequentially arranged on an upper surface of the electronic circuit board from left to right; the LED flip chip and the electronic circuit board are fixedly connected through a thermosetting die-bond insulating adhesive bonded between the LED flip chip nonmetallic region and the circuit board nonmetallic region; and the LED flip chip positive electrode and the LED flip chip negative electrode are respectively conductively connected with the circuit board positive electrode and the circuit board negative electrode in a direct metal-metal contact manner.

The thermosetting die-bond insulating adhesive is one of phenolic aldehyde, amino, epoxy, polyurethane, unsaturated polyester, organosilicone and acrylic resin or is a thermosetting die-bond insulating adhesive modified by taking one of the above materials as a matrix.

A metal electrode bonding pad surface on the electronic circuit board is a rough surface.

Embodiments of the present invention further provide a mounting method of an LED flip chip die-bond conductive adhesive structure with simple process, fewer operation processes, low equipment investment, low production and processing cost, high production efficiency and easiness of realizing large-scale automatic production.

The mounting method of the LED flip chip die-bond conductive adhesive structure comprises the following steps:

(1) dispensing a thermosetting die-bond insulating adhesive in a central position region of a nonmetallic region between circuit board positive and negative electrodes between the circuit board positive electrode region and the circuit board negative electrode region on the electronic circuit board on an automatic die bonder;

(2) performing die-bonding conductive adhesion on the LED flip chip and the electronic circuit board, and enabling two central position regions between a nonmetallic region between the LED flip chip positive electrode and the LED flip chip negative electrode and a nonmetallic region between the circuit board positive electrode and the circuit board negative electrode to be coincided; and (3) heating coincided elements, and shrinking volume of the thermosetting die-bond insulating adhesive after cooling, thereby realizing metal-metal contact type conductive connection between the LED flip chip positive electrode region and the circuit board positive electrode region and between the LED flip chip negative electrode region and the circuit board negative electrode region.

A heating temperature in the step (3) is 150° C., and time is 90 minutes.

The implemented embodiments of the present invention have beneficial effects as follows:

In embodiments of the present invention, metal-metal contact conductive connection is realized between the LED flip chip positive and negative electrodes and the positive and negative electrodes on the electronic circuit, so that conductivity can be improved, and contact resistance can be reduced.

Due to the metal-metal contact conductive connection in embodiments of the present invention, heat produced by the chip can be rapidly conducted, thereby guaranteeing normal operation of the chip, improving a lighting effect of the chip and prolonging service life of the chip.

In embodiments of the present invention, universality is excellent, die-bond mounting and assembling of LED flip chips on a ceramic circuit board, a metal based circuit board, an epoxy glass fiber circuit board, a flexible circuit board and a glass circuit board can be met, and mounting and assembling of other electronic elements can also be met.

In embodiments of the present invention, mounting and assembling needs of chips with small spacing can be met, and die-bond mounting and assembling density of the chips can be greatly improved, thereby realizing small-size compact die-bond mounting and assembling.

Embodiments of the present invention are wide in colloid selection range and high in universality and have advantages of low colloid cost, easiness storage and preservation and the like.

In embodiments of the present invention, an LED flip chip die-bond process is greatly simplified, small-spacing die bonding can be implemented on existing equipment, and a process bottleneck of existing LED flip chip die-bonding is broken through. Therefore, the LED flip chip die-bond conductive adhesive structure has the advantages of simple process, fewer operation processes, low equipment investment, low production and processing cost, high production efficiency and easiness of realizing large-scale automatic production.

Figure 1:
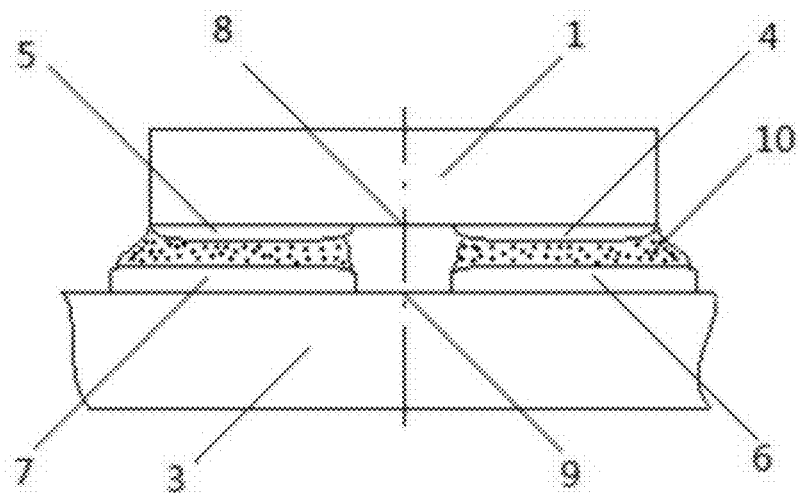
FIG. 1 is a structural schematic diagram of an LED flip chip die-bond structure in the prior art.

In the figures: 1. LED flip chip; 2. thermosetting die-bond insulating adhesive; 3. electronic circuit board; 4. LED flip chip positive electrode region; 5. LED flip chip negative electrode region; 6. circuit board positive electrode region; 7. circuit board negative electrode region; 8. nonmetallic region between LED flip chip positive and negative electrodes; 9. nonmetallic region between circuit board positive and negative electrodes; 10. ACP (Anisotropic Conductive Pastes); 11. bonding pad of electronic circuit board electrode; 12. oil-injected electronic circuit board; 13. silver-plated layer; 14. copper-plated layer; 15. epoxy resin particle; 16. DX20C thermosetting insulating adhesive; 17. T15 ceramic based electronic circuit board; 18. Au/Ag contact interface; 19. 3014LED flip chip; 20. electronic element; and 21. partial enlarged drawing of metal electrode A of electronic element.

DETAILED DESCRIPTION OF PREFERRED EMBODIMENTS

The present invention is further described below in combination with drawings for clarifying purposes, technical solutions and advantages of the present invention.

In embodiments of the present invention, an LED flip chip die-bond conductive adhesive structure comprises an LED flip chip and an electronic circuit board, wherein an LED flip chip negative electrode, an LED flip chip nonmetallic region and an LED flip chip positive electrode are sequentially arranged on a lower surface of the LED flip chip from left to right; a circuit board negative electrode, a circuit board nonmetallic region and a circuit board positive electrode are sequentially arranged on an upper surface of the electronic circuit board from left to right; the LED flip chip and the electronic circuit board are fixedly connected through a thermosetting die-bond insulating adhesive bonded between the LED flip chip nonmetallic region and the circuit board nonmetallic region; and the LED flip chip positive electrode and the LED flip chip negative electrode are respectively conductively connected with the circuit board positive electrode and the circuit board negative electrode in a direct metal-metal contact manner; the thermosetting die-bond insulating adhesive is one of phenolic aldehyde, amino, epoxy, polyurethane, unsaturated polyester, organosilicone and an acrylic resin or is a thermosetting die-bond insulating adhesive modified by taking one of the above materials as a matrix; and a metal electrode bonding pad surface on the electronic circuit board is a rough surface.

A conductive principle of the present embodiment is as follows:

The surface roughness of metal material manifests as rough surfaces or points formed by microroughness, macroroughness, texture, defects or scratch. In the present embodiment, a bonding pad surface of a metal electrode of an electronic circuit board is optimized into a rough surface, and a rough surface or point formed on the rough surface is conductively bonded with a surface of a metal electrode of an LED flip chip with a relatively small mean roughness through the thermosetting die-bond insulating adhesive, and a volume of the heated and cured thermosetting die-bond insulating adhesive is shrunk, thereby realizing metal-metal contact type conductive connection between the electronic circuit board metal electrode and the LED flip chip metal electrode (with reference to FIG. 2, FIG. 4 and FIG. 7).

The thermosetting insulating adhesive is a high polymer or a prepolymer of a low molecular weight, and is cured into a non-melt insoluble meshed adhesive by heating or adding a curing agent or under conditions of heating and adding the curing agent. Characteristics of the thermosetting insulating adhesive are as follows: adhesive liquid is easy to diffuse and permeate during sizing, and the cured adhesive is high in strength and excellent in toughness, creep resistance and heat resistance. However, the thermosetting insulating adhesive easily causes volume shrinkage and internal stress during curing, so that bonding strength is reduced. A modifier can be added into a thermosetting high-molecule adhesive for overcoming the defect.

The thermosetting resin adhesive comprises main varieties as follows: phenolic aldehyde, amino, epoxy, polyurethane, unsaturated polyester, organosilicone, an acrylic resin, etc.

In an electron industry, a common thermosetting insulating adhesive takes an epoxy resin and an epoxy resin modifier, an acrylic resin agent and an acrylic resin modifier, modified polyurethane, modified organosilicone and other synthetic resins as a base material.

A relationship between the surface roughness of the bonding pad of the metal electrode and electrical parameters of the LED flip chip is as follows:

In the present embodiment, a relationship between mean roughness of the bonding pad surface of the metal electrode and electrical parameters in the present embodiment is as follows: under a constant current condition, the higher the mean roughness of the bonding pad surface of the metal electrode is, the smaller the operating voltage of the LED flip chip is.

In performed contrast experiments, Elec-Tech International SIRIUS-KIK 3014 LED flip chips are respectively subjected to die-bond conductive adhesion on a metal bonding pad (with reference to FIG. 1) with a mean surface roughness Ra of 0.0141 μm and on a metal bonding pad (with reference to FIG. 2) with a mean surface roughness Ra of 0.5103 μm according to the die-bond conductive adhesion manner in the present embodiment. Under a condition that operating current is 150 mA, an operating voltage range measured under the mean surface roughness Ra of 0.0141 μm is 3.0-3.2V, while an operating voltage range measured under the mean surface roughness Ra of 0.5103 μm is 2.8-3.0V.

Figure 13:
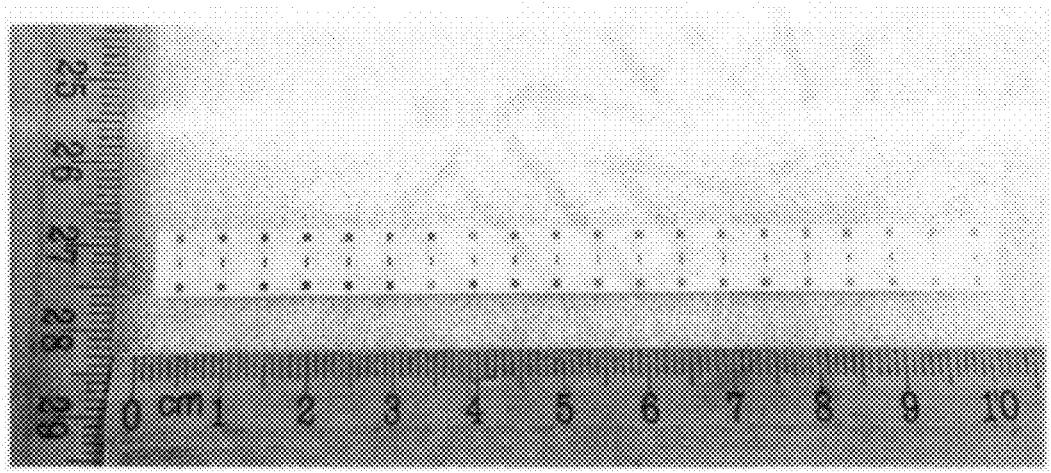
FIG. 13 is a detection sample diagram of surface roughness Ra of a silver-plated bonding pad of a special silver-plated aluminum based experimental board.

A material surface analysis and detection experimental report in the present embodiment Table 1 Roughness Ra(μm) (see FIG. 13 for samples):
Sample Measuring point 1 Measuring point 2 Measuring point 3 Measuring point 4 Measuring point 5 Mean Surface roughness of a silver-plated bonding pad of a special silver-plated aluminum based experimental board 0.0136 0.0124 0.0165 0.0139 0.0139 0.0141

Figure 14:
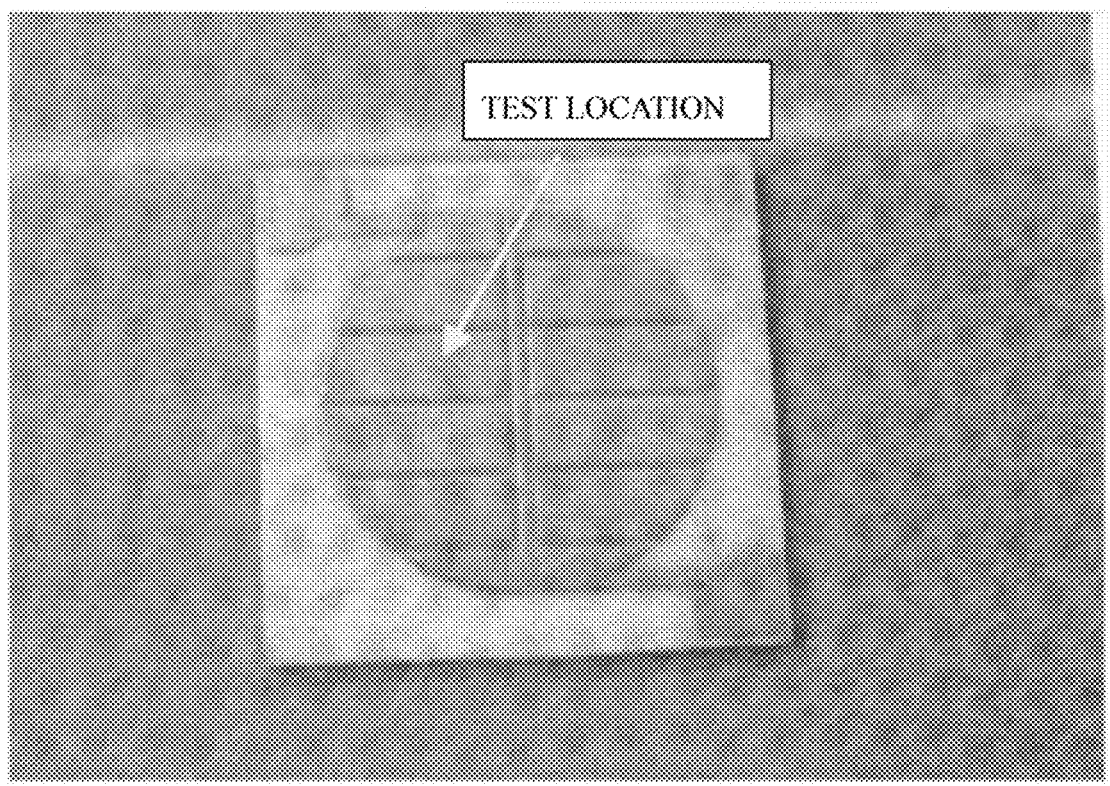
FIG. 14 is a detection sample diagram of roughness Ra of a ceramic based silver-precipitated circuit board.

Table 2 Roughness Ra(μm) (see FIG. 14 for samples):
Sample Measuring point 1 Measuring point 2 Measuring point 3 Measuring point 4 Measuring point 5 Mean Ceramic based silver-precipitated circuit board 0.5167 0.4653 0.4628 0.5382 0.5685 0.5103

Figure 9:
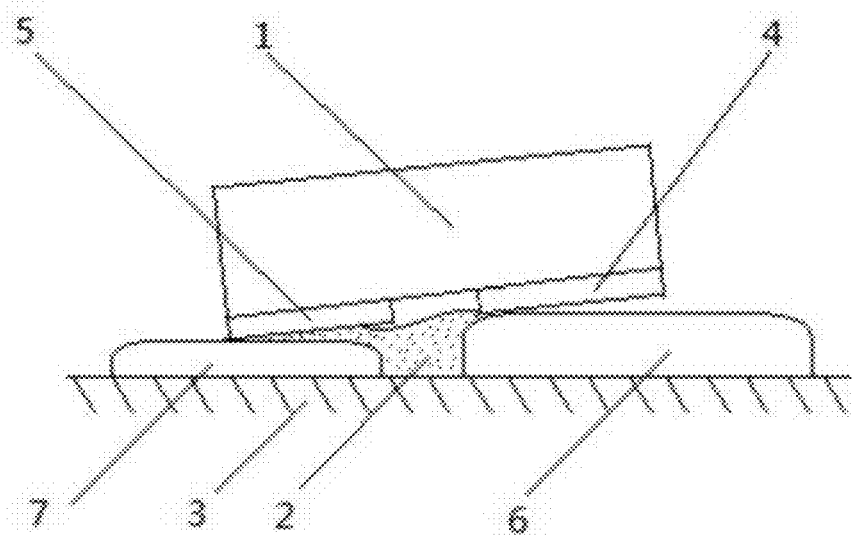
FIG. 9 is a structural schematic diagram of a metal electrode of which surface planeness (or flatness) influences conductivity property.

A relationship between flatness of the bonding pad of the metal electrode and conductivity property is as follows:

In the present embodiment, for a plane formed by positive and negative bonding pads of the metal electrode on the electronic circuit board, surface planeness (or flatness) of the plane is one of main factors influencing the conductivity property of the present embodiment. According to the conductive principle of the present embodiment, the larger the contact area between the bonding pad of the metal electrode on the electronic circuit board and the metal electrode of the LED flip chip is, the higher the conductive efficiency is. For a plane formed by positive and negative bonding pads of the metal electrode on the electronic circuit board, a surface of the plane has excellent planeness (or flatness), and a contact area for realizing metal-metal contact type conduction between the metal electrode of the LED flip chip and the bonding pad of the metal electrode on the electronic circuit board can be fully guaranteed, so that the excellent surface planeness (or flatness) contributes to obtaining excellent conductivity property in the present embodiment, otherwise poor planeness (or flatness) may reduce the contact area for realizing metal-metal contact type conduction after die-bonding, thereby influencing the conductivity property in the present embodiment (with reference to FIG. 9).

Figure 12:
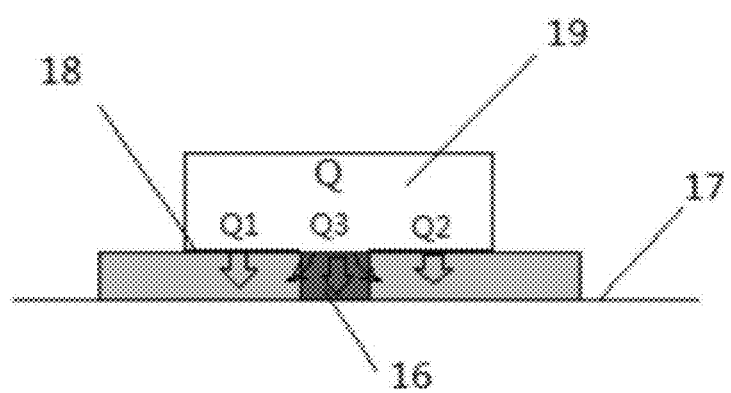
FIG. 12 is a heat management diagram.

Heat management analysis in the present embodiment (with reference to FIG. 12):

1) Material Data:

A structure size of an Elec-Tech International SIRIUS-KIK 3014LED flip chip 19: a size of an Au electrode (a positive or negative electrode): length of 272 μm*width of 294 μm, and a size of a nonmetallic region in a gap between the two electrodes: gap of 150 μm*width of 2941 μm. Total length of 780 μm of a 3014 chip*total width of 380 μm.

T15 ceramic based electronic circuit board 17:

A size of a gap between the positive and negative electrodes of the circuit board: 0.25 mm.

A thickness of a silver firing layer of the electrode bonding pad (positive or negative electrode) is equal to 10-12 μm. An intermediate value of 11 μm is taken during calculation.

(The data is provided by Shanghai Tushengyuan New Material Technology Co. Ltd.)

Technical parameters of an ECCOBOND DX20C thermosetting insulating adhesive 16:

A surface resistance coefficient: 3.5E14 ohms; a volume resistance coefficient: 1.2E15 ohms A heat conductivity coefficient: 0.9 W/m·K Curing conditions: 150° C.-160° C.; 90 minutes (The data is provided by an ECCOBOND DX20C agent, that is, Reed Electromechanics (Shenzhen) Co., Ltd.)

2) Heat Management Analysis in Solutions of the 3014 Chip:

A heat source Q produced by the 3014 LED flip chip 19 can be approximately decomposed in three main heat conduction paths, that is, Q1, Q2 and Q3.

A heat conduction interface of the Q1 and Q2 is an Au—Ag contact interface 18, wherein Q1 can be approximately equal to Q2.

For the heat conduction path of Q3, a heat-transfer medium of the Q3 is an ECCOBOND DX20C thermosetting insulating adhesive 16, and the heat conductivity coefficient of the adhesive is 0.9 W/mK, so the path Q3 is an auxiliary heat conduction path of the 3014LED flip chip 19. It should be added that one part of heat in the heat conduction path of Q3 is conducted through an adhesive-Ag interface direction formed by the DX-20C thermosetting insulating adhesive 16 and an Ag electrode bonding pad on the T15 ceramic based electronic circuit board 17, and the heat conduction path of the part of heat is Q3→DX20C→Ag bonding pad→ceramic based board. Since the heat conductivity coefficient of the Ag is 421.5 W/mK and is 468 times that of the heat conductivity coefficient of the DX20C thermosetting insulating adhesive 16, a heat conductivity rate in the path is higher than that of the heat transfer path of Q3→DX20C→ceramic based board.

Therefore, the heat conductivity rate Q1 or Q2>Q3→DX20C→ceramic based board>Q3.

3) Heat Resistance of the Insulating Adhesive is Calculated as Follows:

Heat resistance of the DX20C thermosetting insulating adhesive:

$$Rj=d/(\lambda*S)$$

An area of a nonmetallic region of the 3014 chip:

$$S=0.25 \text{ mm}*380 \text{ μm}=0.25*10-3*380*10-6=95'10-9 \text{ m2}$$

A thickness of a silver layer of the T15 ceramic sintered silver circuit board is 10-12 μm. d=11 μm=11*10-6 m $$\lambda=0.9 \text{ W/mK}$$

then $Rj=d/(\lambda*S)=11*10-6/(0.9*95*10-9)=1.29*10^{2}°$ C./W.

Therefore, the heat resistance Rj of the insulating adhesive in the present embodiment is 129° C./W.

The heat resistance of the 3014 chip and the T15 ceramic based circuit board:

The 3014 chip is in die-bond contact with the bonding pad of the circuit board electrode on the T15 ceramic based circuit board and is in a metal (Au)-metal (Au) contact manner. Therefore, this belongs to heat conduction with high heat conductivity.

4) Analysis of an area ratio of the heat conduction path:

A total area of a gold bonding pad of the chip is:

$$2*(272 \text{ μm}*294 \text{ μm})=15.99*10^{4} \text{ μm2}$$

An area covered by the insulating adhesive is about: 0.25 mm*380 µm=0.25*103*380=9.5 *104 µm2; a ratio of the total area of the metal electrode to the area covered by the insulating adhesive is equal to (2*15.99*104)/9.5*104=3.37:1, that is, the area of the electrode metal of the LED chip is nearly 3.5 times that of the area of the nonmetallic region.

It can be seen from the above calculation and analysis that: the main path of the heat conduction in the present embodiment is metal-metal contact type heat conduction, and the chip belongs to a high-heat conductor. Therefore, the solution has excellent heat conductivity property.

Embodiments of the present invention further provide a mounting method of the LED flip chip die-bond conductive adhesive structure with simple process, fewer operation processes, low equipment investment, low production and processing cost, high production efficiency and easiness of realizing large-scale automatic production.

Equipment: a Dazu laser 3201 die bonder, an LED-2A LED photoelectric oven in Shenzhen Yihexing Machinery Equipment Co., Ltd.

An electronic circuit board: T15 ceramic electronic circuit board in Shanghai Tushengyuan New Material Technology Co. Ltd.

A power source: Beijing Hansheng Puyuan HSPY-200-01 digital constant-current source.

A thermosetting die-bond insulating adhesive: ECCO-BOND DX20C

An LED flip chip: Elec-Tech International SIRIUS-KIK 3014.

Figure 4:
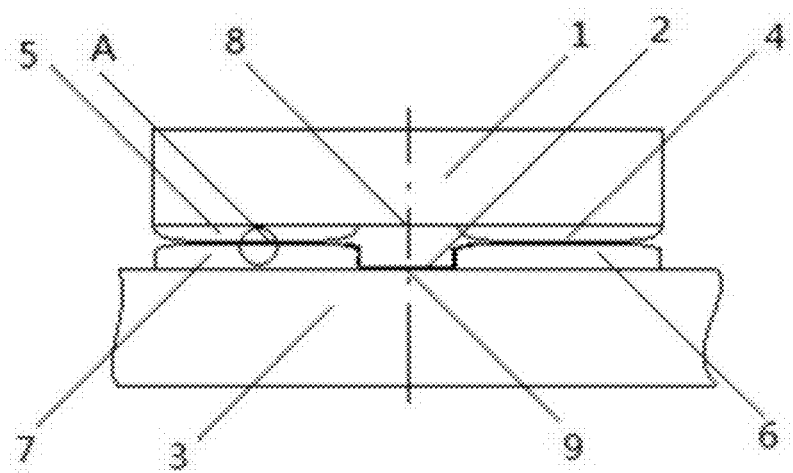
FIG. 4 is a structural schematic diagram of a low-viscosity die-bond insulating adhesive die-bonded and cured on an electronic circuit board not subjected to oil injection.
Figure 7:
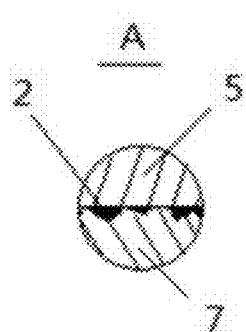
FIG. 7 is a schematic diagram of a spreading situation of cured colloid of a low-viscosity die-bond insulating adhesive on a metal-metal interface.

The mounting method of the LED flip chip die-bond conductive adhesive structure comprises the following steps:

(1) dispensing a thermosetting die-bond insulating adhesive in a central position region of a nonmetallic region between circuit board positive and negative electrodes between the circuit board positive electrode region and the circuit board negative electrode region on the electronic circuit board on an automatic die bonder;

(2) then performing die-bonding conductive adhesion on the LED flip coincided chip and the electronic circuit board, and enabling two central position regions between a nonmetallic region between the LED flip chip positive electrode and the LED flip chip negative electrode and a nonmetallic region between the circuit board positive electrode and the circuit board negative electrode to be; and (3) heating coincided components under conditions of 150° C./90 minutes, and shrinking volume of the thermosetting die-bond insulating adhesive after cooling, thereby realizing metal-metal contact type conductive connection between the LED flip chip positive electrode region and the circuit board positive electrode region and between the LED flip chip negative electrode region and the circuit board negative electrode region, and then completing typical embodiments of the present patent (with reference to FIG. 4 and FIG. 7).

ILLUSTRATIVE DESCRIPTION OF OTHER EMBODIMENTS

Since conditions of various electronic circuit boards are different in production practice, states of thermosetting die-bond insulating adhesives in the present patent are different.

Embodiment 1

Figure 5:
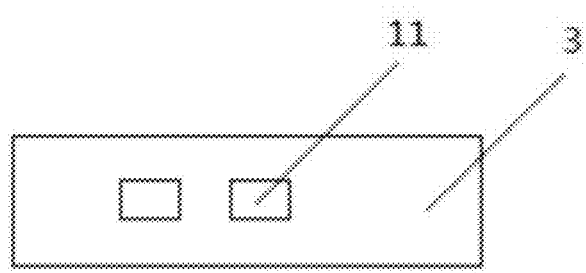
FIG. 5 is a top view of an electronic circuit board not subjected to oil injection on a surface.

FIG. 5 is a top view of an electronic circuit board not subjected to oil injection on a surface. When a low-viscosity thermosetting die-bond insulating adhesive 2 is adopted for performing die-bond conductive adhesion in FIG. 5, the low-viscosity thermosetting die-bond insulating adhesive 2 has better spreadability after heated, and a structure in FIG. 4 may appear (with reference to FIG. 4 and FIG. 7).

Embodiment 2

Figure 2:
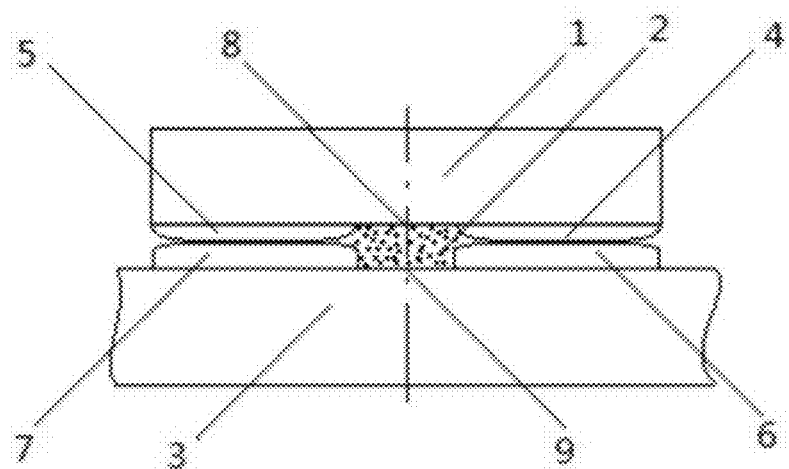
FIG. 2 is a structural schematic diagram of an LED flip chip die-bond structure in the present embodiment.
Figure 3:
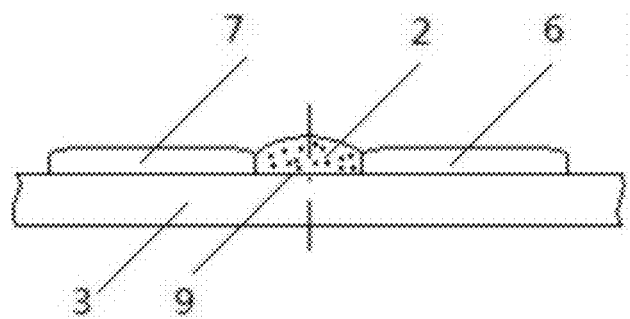
FIG. 3 is a schematic diagram of sizing in a nonmetallic region of an electronic circuit board in the present embodiment.
Figure 6:
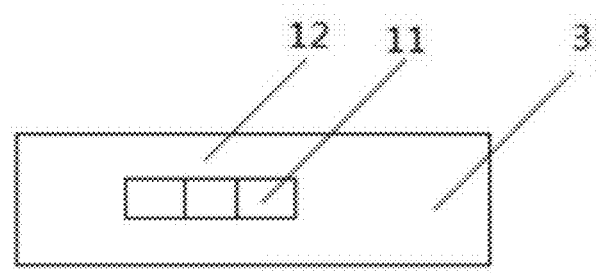
FIG. 6 is a top view of an electronic circuit board subjected to oil injection on a surface.

FIG. 5 is changed to FIG. 6 (a top view of an electronic circuit board subjected to oil injection on a surface) on the basis of embodiment 1, and when other conditions are invariable, a structure of FIG. 2 may appear (with reference to FIG. 2).

Embodiment 3 the low-viscosity thermosetting die-bond insulating adhesive 2 has excellent spreadability and film-forming property after pressurized and heated, and will form an adhesive film at a gap part of the metal-metal contact interface after cured, and a size of the formed area is related to factors such as a wetting angle of an adhesive-solid interface, pressure during die-bonding, temperature in the heating and curing process and the like. The adhesive film formed at the gap part of the metal-metal contact interface has beneficial effects as follows: air in the gap between the interfaces can be eliminated, so that an influence of air on a thermal expansion coefficient of an adhesive body can be effectively solved, erosion of the air on surface metals can be inhibited, conductivity property and peel resistance strength of die-bond adhesion can be improved, and a heat-conducting area can be enlarged in an assisted manner (with reference to FIG. 4 and FIG. 7).

Embodiment 4 due to high viscosity, a high-viscosity thermosetting die-bond insulating adhesive 2 has a large wetting angle on a liquid-solid interface, even if spreadability of the high-viscosity thermosetting die-bond insulating adhesive 2 is poor after pressurized and heated, and a structural state formed by the high-viscosity thermosetting die-bond insulating adhesive 2 after cured is shown in FIG. 2 (with reference to FIG. 2).

Embodiment 5

Figure 8:
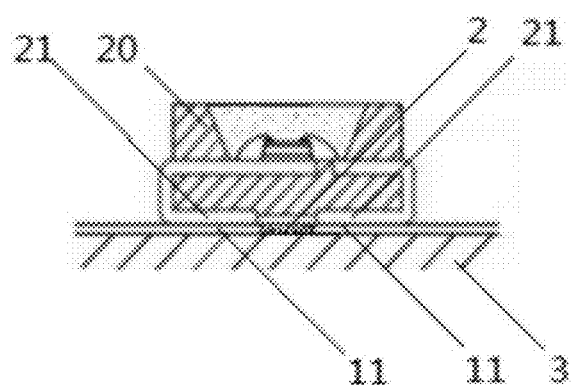
FIG. 8 is a structural schematic diagram when a bonding object is an electronic element.

When a bonding object of the thermosetting die-bond insulating adhesive 2 is changed to an electronic element 20, a metal electrode surface formed by a bonding pad 11 of a circuit board electrode on the electronic circuit board 3 and a metal electrode surface formed by a metal electrode 21 of an electronic element below the electronic element 20 have higher planeness, and at least one of the metal electrode surfaces is a rough surface. FIG. 8 is a structural schematic diagram under the situation (with reference to FIG. 8).

Figure 10:
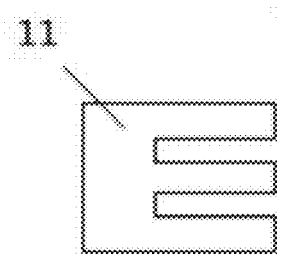
FIG. 10 is an illustrative schematic diagram of change of a bonding pad of a circuit board electrode.
Figure 11:
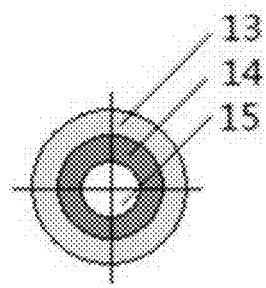
FIG. 11 is a structural schematic diagram of novel conductive particles.

The present patent has many changes, such as changes of surface microroughness, macroroughness and texture, shape changes of the chip metal electrodes and the metal bonding pad (such as one change illustrated in FIG. 10), etc.

For further mining and application prospects of the present patent, the further mining of the present patent refers to an improvement of the thermosetting die-bond insulating adhesive, and an improvement direction refers to mining as follows: the thermosetting die-bond insulating adhesive has a heating and curing temperature of 120° C., is high-temperature resistant, has a thermal expansion coefficient close to that of non-ferrous metals (such as copper, silver, gold and aluminum), and is excellent in adhesive spreadability, high in peel resistance strength and good in toughness. The application is developed towards ordinary electronic components.

The above only discloses preferred embodiments of the present invention and certainly shall not be used for limiting a scope of protection of the present invention. Therefore, equivalent changes made according to claims of the present invention still belong to the scope covered by the present invention.

I claim:

1. An LED flip chip die-bond conductive adhesive structure, comprising
an LED flip chip, and
an electronic circuit board;
wherein an LED flip chip negative electrode, an LED flip chip nonmetallic region and an LED flip chip positive electrode are sequentially arranged on a lower surface of the LED flip chip from left to right;
a circuit board negative electrode, a circuit board nonmetallic region and a circuit board positive electrode are sequentially arranged on an upper surface of the electronic circuit board from left to right;
the LED flip chip and the electronic circuit board are fixedly connected through a thermosetting die-bond insulating adhesive bonded between the LED flip chip nonmetallic region and the circuit board nonmetallic region;
the LED flip chip positive electrode is conductively connected to the circuit board positive electrode by means of metal-metal contact, and forms a first metal-metal contact interface between the LED flip chip positive electrode and the circuit board positive electrode;
the LED flip chip negative electrode is conductively connected to the circuit board negative electrode by means of metal-metal contact, and forms a second metal-metal contact interface between the LED flip chip negative electrode and the circuit board negative electrode; and
an adhesive film of the thermosetting die-bond insulating adhesive is formed at a gap part of both the first metal-metal contact interface and the second metal-metal contact interface.

2. The LED flip chip die-bond conductive adhesive structure according to claim 1, wherein the thermosetting die-bond insulating adhesive is one of phenolic aldehyde, amino, epoxy, polyurethane, unsaturated polyester, organosilicone and an acrylic resin or is a thermosetting die-bond insulating adhesive modified by taking one of the above materials as a matrix.

3. The LED flip chip die-bond conductive adhesive structure according to claim 1, wherein a bonding pad surface of a metal electrode on the electronic circuit board is a rough surface.

* * * * *